(12) United States Patent
Chen et al.

(10) Patent No.: US 12,228,146 B2
(45) Date of Patent: Feb. 18, 2025

(54) HEAT DISSIPATION MODULE

(71) Applicant: Auras Technology Co., Ltd., New Taipei (TW)

(72) Inventors: Chih-Wei Chen, New Taipei (TW); Cheng-Ju Chang, New Taipei (TW); Hsiang-Chih Chuang, New Taipei (TW); Jyun-Wei Huang, New Taipei (TW); Yi-Le Cheng, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 222 days.

(21) Appl. No.: 17/888,362

(22) Filed: Aug. 15, 2022

(65) Prior Publication Data

US 2023/0413483 A1 Dec. 21, 2023

(30) Foreign Application Priority Data

Jun. 15, 2022 (TW) .................................. 111122233

(51) Int. Cl.

| | |
|---|---|
| *F04D 29/58* | (2006.01) |
| *F04D 29/42* | (2006.01) |
| *H05K 7/20* | (2006.01) |
| *F04D 17/02* | (2006.01) |
| *F04D 25/06* | (2006.01) |

(52) U.S. Cl.
CPC ..... *F04D 29/5806* (2013.01); *F04D 29/4293* (2013.01); *H05K 7/20254* (2013.01); *H05K 7/20272* (2013.01); *H05K 7/20327* (2013.01); *H05K 7/2039* (2013.01); *H05K 7/20418* (2013.01); *F04D 17/025* (2013.01); *F04D 25/06* (2013.01); *F04D 29/426* (2013.01); *F04D 29/588* (2013.01); *H05K 7/20318* (2013.01)

(58) Field of Classification Search
CPC ............ F04D 29/5806; F04D 29/4293; H05K 7/20254; H05K 7/20272; H05K 7/20327; H05K 7/2039; H05K 7/20418; H05K 7/20318; F28D 15/025; F28D 15/0275; F28D 15/04
See application file for complete search history.

(56) References Cited

U.S. PATENT DOCUMENTS

| | | | |
|---|---|---|---|
| 6,917,522 B1 * | 7/2005 | Erturk ................... | H01L 23/427 174/15.2 |
| 7,277,287 B2 * | 10/2007 | Chen ..................... | H01L 23/427 165/80.4 |
| 7,298,620 B2 * | 11/2007 | Wu ...................... | F28D 15/0275 165/80.4 |
| 7,540,318 B2 * | 6/2009 | Nitta ..................... | H01L 23/427 257/715 |

(Continued)

*Primary Examiner* — Tho V Duong

(74) *Attorney, Agent, or Firm* — MUNCY, GEISSLER, OLDS & LOWE, P.C.

(57) ABSTRACT

A heat dissipation module includes a main vapor chamber, at least one auxiliary vapor chamber, a main heat dissipation fin set and at least one auxiliary heat dissipation fin set. The auxiliary vapor chamber is in fluid communication with the main vapor chamber, the main heat dissipation fin set is installed on the main vapor chamber, the auxiliary heat dissipation fin set is connected to the auxiliary vapor chamber, and the auxiliary vapor chamber is arranged between the main heat dissipation fin set and the auxiliary heat dissipation fin set.

17 Claims, 6 Drawing Sheets

(56) References Cited

U.S. PATENT DOCUMENTS

| | | | |
|---|---|---|---|
| 7,650,931 B2* | 1/2010 | Siu | F28D 15/0233 29/890.032 |
| 7,692,925 B1* | 4/2010 | Liu | H01L 23/427 361/679.48 |
| 2006/0039111 A1* | 2/2006 | Huang | H01L 23/427 361/698 |
| 2014/0083653 A1* | 3/2014 | Kempers | F28D 15/046 165/104.21 |

* cited by examiner

HEAT DISSIPATION MODULE

RELATED APPLICATIONS

This application claims priority to U.S. Provisional Application Ser. No. 63/237,328, filed Aug. 26, 2021, and Taiwan Application Serial Number 111122233, filed Jun. 15, 2022, the disclosures of which are incorporated herein by reference in their entireties.

TECHNICAL FIELD

The present disclosure generally relates to a heat dissipation module. More particularly, the present disclosure relates to a heat dissipation module with a three-dimensional vapor chamber.

BACKGROUND

With the increasing computing capability of computers, the temperature control of electronic components such as central processing units and other electronic components is becoming more and more important. When the computing speed of the working chip (i.e. the heat source) in the computer system continues to increase, the ambient temperature in the computer system is increased so as to reduce the computer system stability. In order to solve the above problem, people combine the heat pipes with heat dissipation fins to form the heat dissipation module to contact the working chip, so that the heat of the working chip can be discharged out of the computer system through the heat dissipation module to control the temperature of the computer system, and then maintain computer system stability.

Generally speaking, the heat pipe of the heat dissipation module is connected to the heat source that needs to be dissipated, and the heat pipe is connected to the heat dissipation fins, so that the heat is delivered to the heat dissipation fins by the heat pipe, and then exhausted out of the computer system to improve the working reliability of the electronic components.

However, in the face of increasing technological progress, there is still room for improving the heat dissipation module. Therefore, there is a need to improve the performance of the heat dissipation module for the computer system.

SUMMARY

One objective of the embodiments of the present invention is to provide a heat dissipation module to improve the cooling efficiency of the heat dissipation module.

To achieve these and other advantages and in accordance with the objective of the embodiments of the present invention, as the embodiment broadly describes herein, the embodiments of the present invention provides a heat dissipation module. The heat dissipation module includes a main vapor chamber, at least one auxiliary vapor chamber, a main heat dissipation fin set and at least one auxiliary heat dissipation fin set. The auxiliary vapor chamber is in fluid communication with the main vapor chamber. The main heat dissipation fin set is installed on the main vapor chamber. The auxiliary heat dissipation fin set is connected to the at least one auxiliary vapor chamber. In addition, the auxiliary vapor chamber is arranged between the main heat dissipation fin set and the auxiliary heat dissipation fin set.

In some embodiments, the auxiliary vapor chamber includes a first auxiliary vapor chamber and a second auxiliary vapor chamber. The first auxiliary vapor chamber and the second auxiliary vapor chamber are respectively connected to two opposite sides of the main heat dissipation fin set.

In some embodiments, the auxiliary heat dissipation fin set includes a first auxiliary heat dissipation fin set and a second auxiliary heat dissipation fin set. The first auxiliary vapor chamber is arranged between the main heat dissipation fin set and the first auxiliary heat dissipation fin set, and the second auxiliary vapor chamber is arranged between the main heat dissipation fin set and the second auxiliary heat dissipation fin set.

In some embodiments, the heat dissipation module further includes a supporting frame to support the main heat dissipation fin set, the first auxiliary heat dissipation fin set and the second auxiliary heat dissipation fin set.

In some embodiments, the supporting frame includes a first side beam, a second side beam, a third side beam, a fourth side beam and an opening. The second side beam is arranged opposite to the first side beam, the third side beam is connected on the first side beam and the second side beam, the fourth side beam is connected on the first side beam and the second side beam, and the fourth side beam is arranged opposite to the third side beam. The opening is formed between the first side beam, the second side beam, the third side beam and the fourth side beam, and the first auxiliary vapor chamber and the second auxiliary vapor chamber pass through the supporting frame via the opening.

In some embodiments, the main heat dissipation fin set includes a plurality of heat dissipation fins vertically arranged on the main vapor chamber and fixed on the first side beam and the second side beam of the supporting frame.

In some embodiments, the first auxiliary heat dissipation fin set and the second auxiliary heat dissipation fin set respectively include a plurality of heat dissipation fins horizontally stacked on the third side beam and the fourth side beam of the supporting frame.

In some embodiments, the auxiliary vapor chamber includes a plurality of steam channels formed in the auxiliary vapor chamber.

In some embodiments, the steam channels include a plurality of cylindrical steam channels.

In some embodiments, the steam channels include a plurality of rectangular steam channels.

In some embodiments, the steam channels include a plurality of vertical steam channels.

In some embodiments, the steam channels further include a plurality of horizontal steam channels arranged to intersect with the vertical steam channels.

In some embodiments, the horizontal steam channels are formed by a plurality of spacer bumps and heights of upper surfaces of the spacer bumps below each of the horizontal steam channels gradually decrease while approaching a center of the at least one auxiliary vapor chamber.

In some embodiments, the auxiliary vapor chamber further includes a plurality of fluid return channels, and the plurality of steam channels and the plurality of fluid return channels are staggered.

In some embodiments, the steam channels and the fluid return channels are formed by a plurality of inclined spacer bumps.

In some embodiments, the inclined spacer bumps are wavily arranged to form the steam channels and the fluid return channels, and the inclined spacer bumps are spaced apart from each other so as to form a slot in a wavy turning area.

In some embodiments, one end, adjacent to one of the steam channels, of each of the inclined spacer bumps is higher than another end, adjacent to one of the fluid return channels, of the each of the inclined spacer bumps.

In some embodiments, the steam channels are formed by slots in spacer structures.

In some embodiments, a capillary layer is formed on surfaces of the plurality of steam channels.

In some embodiments, the steam channel further includes a capillary column to connect to the capillary layer and a capillary structure formed on a surface of a lower cover of the main vapor chamber.

Hence, according to the structures described in the foregoing embodiments, the heat dissipation module of the present invention can utilize the steam channel to guide the steam of the working fluid to flow upward, and guide the working fluid to a lower pressure area to condense and reflow. At the same time, with the inclined spacer bumps, capillary layers and capillary columns, the condensed working fluid may be guided to the position, in contact with the heat source, of the main vapor chamber so as to effectively improve the heat dissipation efficiency of the heat dissipation module.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
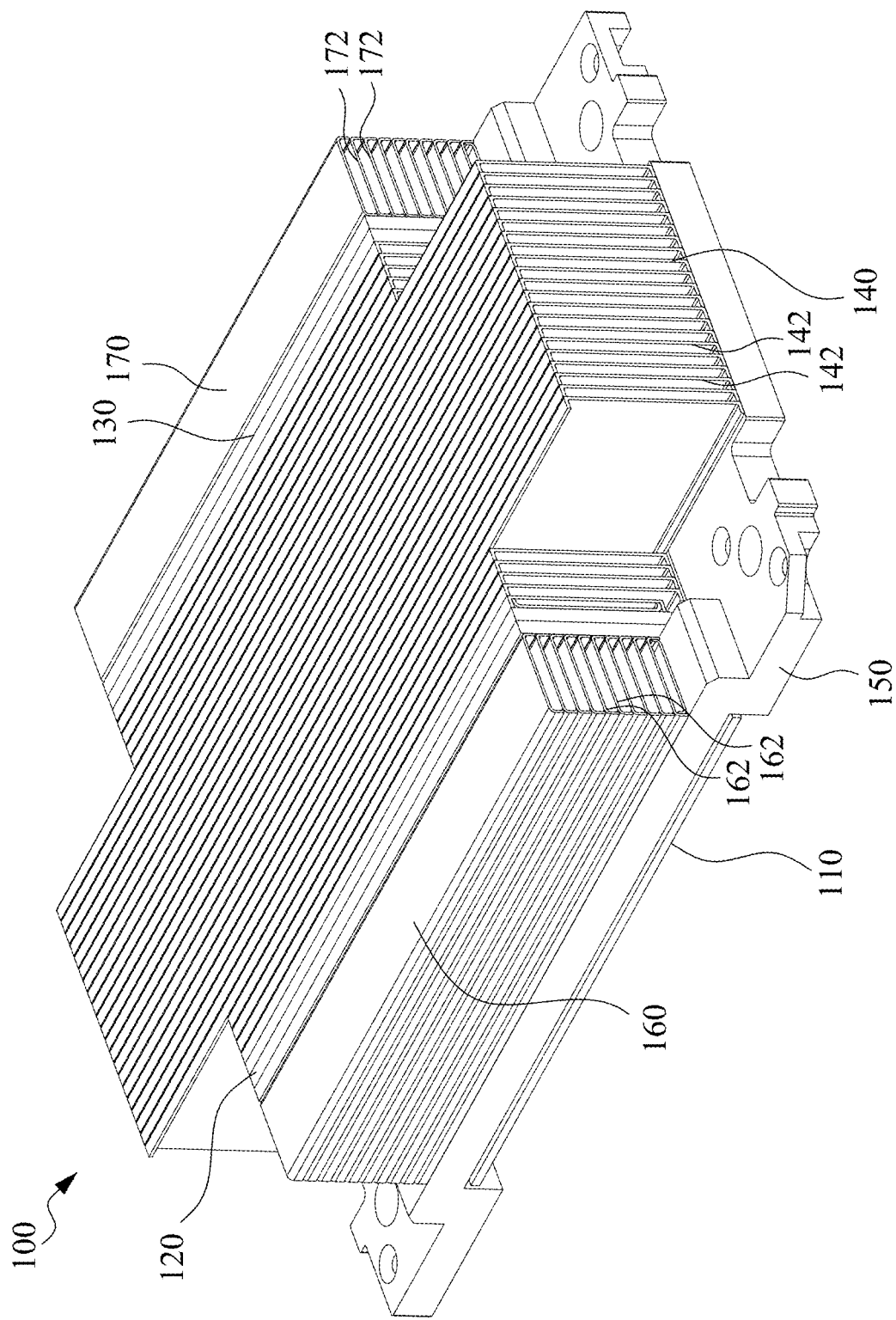
FIG. 1 illustrates a schematic perspective diagram showing a heat dissipation module according to one embodiment of the present invention.
Figure 2:
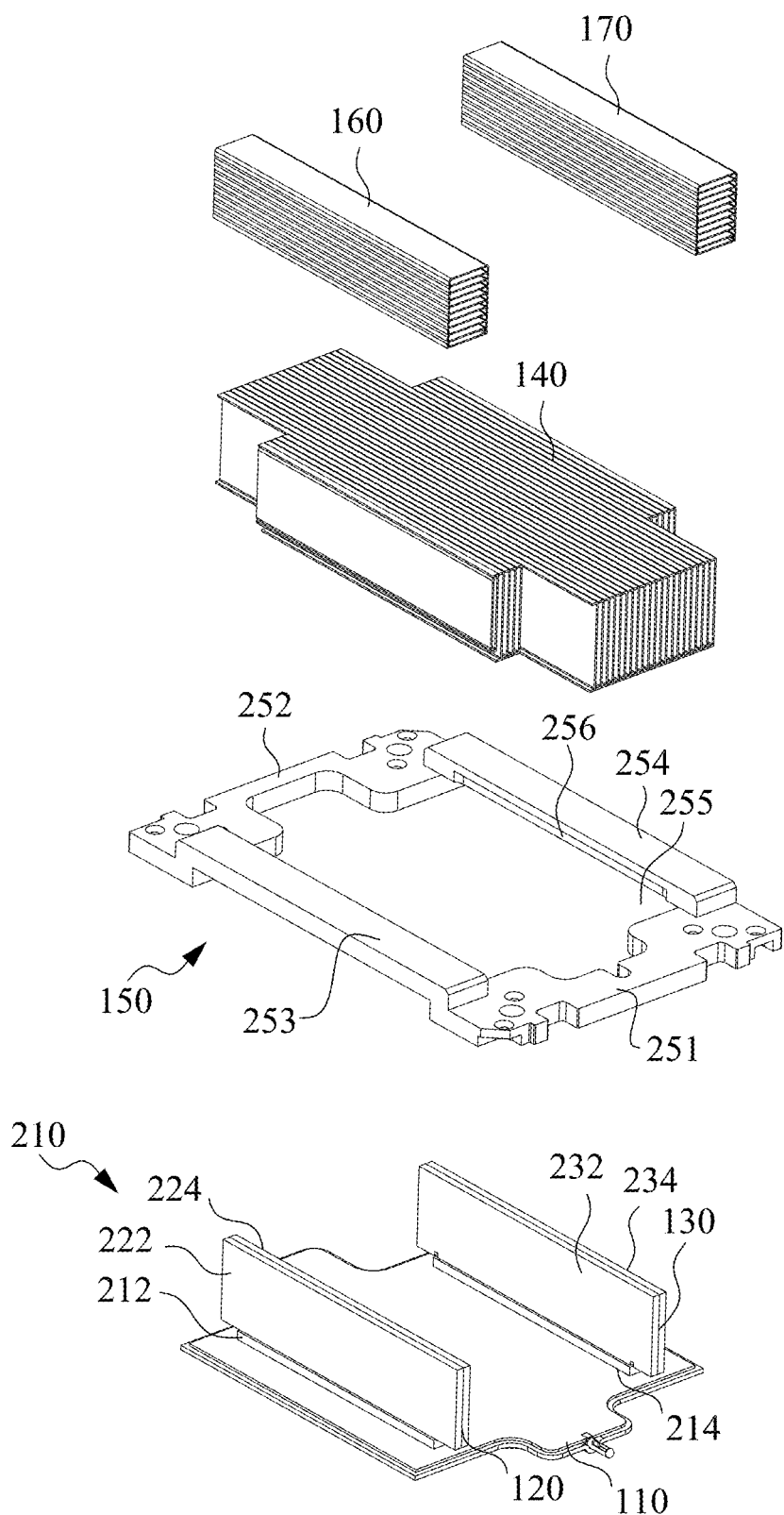
FIG. 2 illustrates a schematic exploded diagram of the heat dissipation module of FIG. 1.

FIG. 1 is a schematic perspective diagram showing a heat dissipation module according to one embodiment of the present invention, and FIG. 2 is a schematic exploded diagram thereof. In addition, FIGS. 3-6 are schematic cross-sectional views of various embodiments thereof.

First referring to FIG. 1 and FIG. 2, the heat dissipation module 100 includes a main vapor chamber 110, at least one auxiliary vapor chamber, a main heat dissipation fin set 140 and at least one auxiliary heat dissipation fin set. In addition, at least one auxiliary vapor chamber includes, for example, a first auxiliary vapor chamber 120 and a second auxiliary vapor chamber 130, and at least one auxiliary heat dissipation fin set includes, for example, a first auxiliary heat dissipation fin set 160 and a second auxiliary heat dissipation fin set 170.

The first auxiliary vapor chamber 120 and the second auxiliary vapor chamber 130 are connected to the main vapor chamber 110, and are in fluid communication with the main vapor chamber 110. The main heat dissipation fin set 140 is installed on the main vapor chamber 110. The first auxiliary heat dissipation fin set 160 and the second auxiliary heat dissipation fin set 170 are respectively connected to a corresponding first auxiliary vapor chamber 120 and a corresponding second auxiliary vapor chamber 130. In some embodiments, the first auxiliary heat dissipation fin set 160 is connected to the first auxiliary vapor chamber 120, and the second auxiliary heat dissipation fin set 170 is connected to the second auxiliary vapor chamber 130. Therefore, the first auxiliary vapor chamber 120 is arranged between the main heat dissipation fin set 140 and the first auxiliary heat dissipation fin set 160, and the second auxiliary vapor chamber 130 is arranged between the main heat dissipation fin set 140 and the second auxiliary heat dissipation fin set 170.

That is to say, the first auxiliary vapor chamber 120 and the second auxiliary vapor chamber 130 are respectively connected to two opposite sides of the main heat dissipation fin set 140.

In some embodiments, the heat dissipation module 100 further includes a supporting frame 150 to support the main heat dissipation fin set 140, the first auxiliary heat dissipation fin set 160 and the second auxiliary heat dissipation fin set 170. The supporting frame 150 includes a first side beam 251, a second side beam 252, a third side beam 253 and a fourth side beam 254. The first side beam 251 is arranged opposite to the second side beam 252, the third side beam 253 is arranged opposite to the fourth side beam 254, the third side beam 253 is connected on the first side beam 251 and the second side beam 252, and the fourth side beam 254 is connected on the first side beam 251 and the second side beam 252. The first side beam 251, the second side beam 252, the third side beam 253 and the fourth side beam 254 form an opening 255, for example, a rectangular opening.

In some embodiments, the main vapor chamber 110 is arranged under the opening 255, and the first auxiliary vapor chamber 120 and the second auxiliary vapor chamber 130 pass through the supporting frame 150 via the opening 255 to connect to the main vapor chamber 110.

In some embodiments, the main vapor chamber 110 is arranged between the first side beam 251 and the second side beam 252, and located under the third side beam 253 and the fourth side beam 254, and the third side beam 253 and the fourth side beam 254 can be a reinforcement structure of the main vapor chamber 110 to suppress the deformation or warpage of the main vapor chamber 110.

In some embodiments, the first auxiliary vapor chamber 120 and the second auxiliary vapor chamber 130 are vertically arranged on the main vapor chamber 110.

In some embodiments, the main heat dissipation fin set 140 includes a plurality of heat dissipation fins 142 are vertically arranged on the main vapor chamber 110, and are fixed on the first side beam 251 and the second side beam 252 of the supporting frame 150.

In some embodiments, the first auxiliary heat dissipation fin set 160 includes a plurality of heat dissipation fins 162, horizontally stacked on the third side beam 253 of the supporting frame 150, and the second auxiliary heat dissipation fin set 170 includes a plurality of heat dissipation fins 172, horizontally stacked on the fourth side beam 254 of the supporting frame 150, to effectively reduce the temperature of the first auxiliary vapor chamber 120 and the second auxiliary vapor chamber 130 as well as the temperature of the main vapor chamber 110.

The first auxiliary vapor chamber 120 includes a first cooling surface 222 and a second cooling surface 224, and the second auxiliary vapor chamber 130 includes a first cooling surface 232 and a second cooling surface 234. In general, the first cooling surface 222 and the second cooling surface 224 of the first auxiliary vapor chamber 120, and the first cooling surface 232 and the second cooling surface 234 of the second auxiliary vapor chamber 130 are cooling shells made of metal material, for example, copper or aluminum cooling shells.

A first engaging protrusion 212 and a second engaging protrusion 214 are formed on the main vapor chamber 110 to connect to the first auxiliary vapor chamber 120 and the second auxiliary vapor chamber 130 so as to form a three-dimensional vapor chamber 210. The first engaging protrusion 212 and the second engaging protrusion 214 may expose an inner space of the main vapor chamber 110 so as to be in fluid communication with the first auxiliary vapor chamber 120 and the second auxiliary vapor chamber 130.

In some embodiments, accommodating indentations 256 are formed under the third side beam 253 and the fourth side beam 254 to accommodate the first engaging protrusion 212 and the second engaging protrusion 214 so that the main vapor chamber 110, the first auxiliary vapor chamber 120 and the second auxiliary vapor chamber 130 may be in close contact with the third side beam 253 and the fourth side beam 254.

Figure 3:
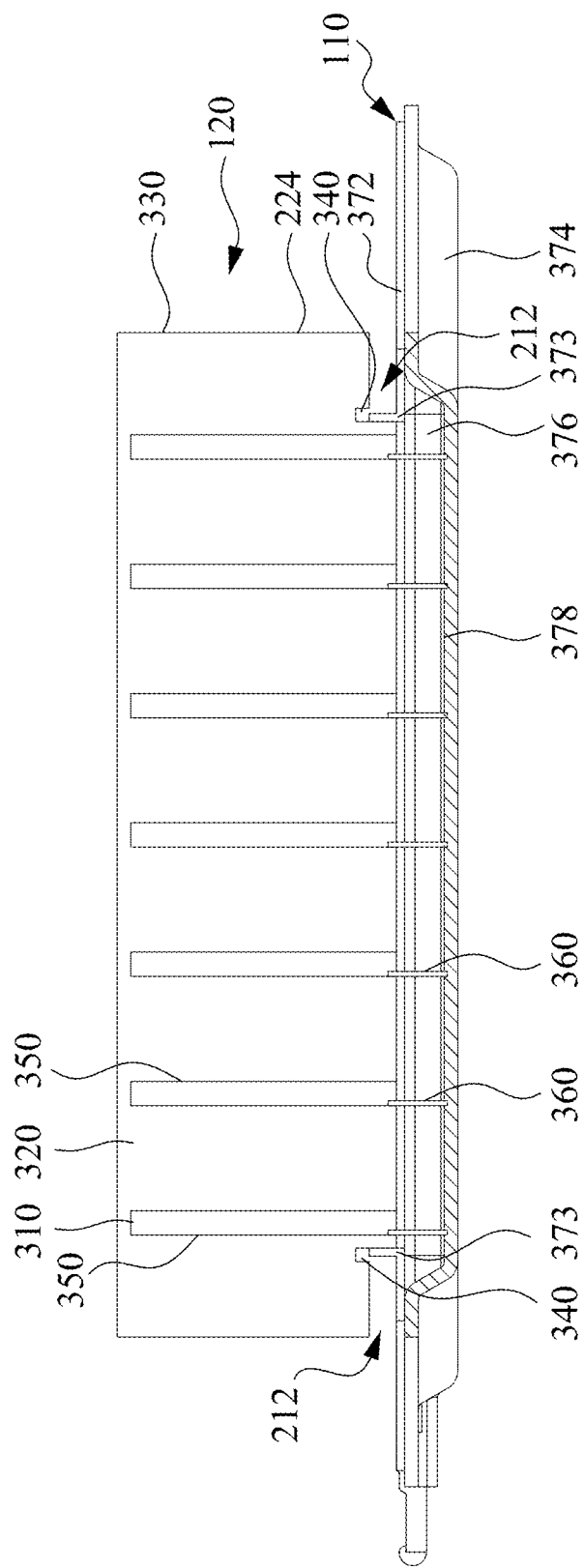
FIG. 3 illustrates a schematic cross-sectional view of an embodiment of the vapor chamber of the heat dissipation module of FIG. 1.

Referring to FIG. 3, a schematic cross-sectional view of an embodiment of the vapor chamber of the heat dissipation module 100 is illustrated. The first auxiliary vapor chamber 120 is taken as an example, and the first cooling surface 222 of the first auxiliary vapor chamber 120 is removed to expose the interior of the second cooling surface 224. In general, the interior of the first cooling surface 222 and the interior of the second cooling surface 224 are symmetrically formed. The first auxiliary vapor chamber 120 includes a plurality of steam channels, for example, cylindrical steam channels 310.

In some embodiments, the exterior of the first auxiliary vapor chamber 120 is a metal shell 330, and a plurality of spacer structures 320 are formed inside the first auxiliary vapor chamber 120. In addition, the cylindrical steam channels 310 are formed between the plurality of spacer structures 320 of the first auxiliary vapor chamber 120 to allow the steam of the working fluid in the main vapor chamber 110 to upwardly deliver to the first auxiliary vapor chamber 120 through the cylindrical steam channels 310 so as to deliver the heat carried by the working fluid to the main heat dissipation fin set 140 and the auxiliary heat dissipation fin set through the first cooling surface 222 and the second cooling surface 224 to dissipate the heat. In addition, the condensed working fluid may flow down to a chamber 376 of the main vapor chamber 110 by way of the spacer structure 320.

In some embodiments, the spacer structures 320 are made of metal structures or capillary structures.

In some embodiments, the first auxiliary vapor chamber 120 further includes a capillary layer 350, for example, a fiber layer, a sintered powder layer or a metal wire mesh layer, to form on the surface of the cylindrical steam channel 310. When the steam of the working fluid is condensed, the return speed of the condensed working fluid is accelerated through the capillary layer 350 so as to guide the condensed working fluid down to the main vapor chamber 110, and further deliver the condensed working fluid to the position, in contact with the heat source, of the main vapor chamber 110.

In some embodiments, the first auxiliary vapor chamber 120 further includes capillary columns 360, for example, fiber columns, sintered powder columns or metal wire mesh columns, to connect the capillary layer 350 and the capillary structure 378 on the inner surface of the lower cover 374 of the main vapor chamber 110 so as further to accelerate the return speed of the condensed working fluid.

In some embodiments, the first auxiliary vapor chamber 120 further includes a welding notch 340, and the first engaging protrusion 212 of the main vapor chamber 110 includes a welding protrusion 373 formed on the upper cover 372 to increase the tightness between the auxiliary vapor chamber 120 and the main vapor chamber 110. The welding notch 340 is located on the welding protrusion 373 and expose the welding protrusion 373, and the solder is disposed between the welding notch 340 and the welding protrusion 373 so as to further stably and tightly fix the first auxiliary vapor chamber 120 in the first engaging protrusion 212 of the main vapor chamber 110.

Figure 4:
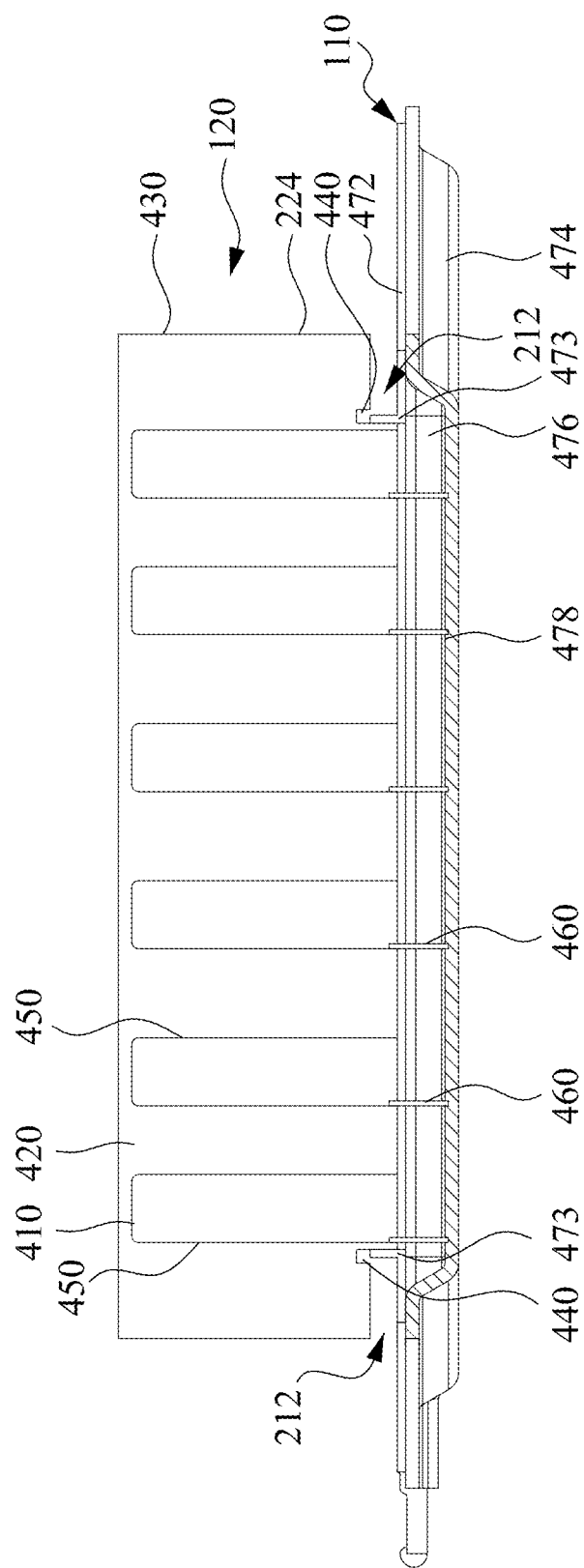
FIG. 4 illustrates a schematic cross-sectional view of another embodiment of the vapor chamber of the heat dissipation module of FIG. 1.

Referring to FIG. 4, a schematic cross-sectional view of another embodiment of the vapor chamber of the heat dissipation module 100 is illustrated. The first auxiliary vapor chamber 120 is also taken as an example, and the first cooling surface 222 of the first auxiliary vapor chamber 120 is removed to expose the interior of the second cooling surface 224. In general, the interior of the first cooling surface 222 and the interior of the second cooling surface 224 are symmetrically formed. The first auxiliary vapor chamber 120 includes a plurality of steam channels, for example, rectangular steam channels 410.

In some embodiments, the exterior of the first auxiliary vapor chamber 120 is a metal shell 430, and a plurality of spacer structures 420 are formed inside the first auxiliary vapor chamber 120. In addition, the rectangular steam channel 410 are formed between the plurality of spacer structures 420 of the first auxiliary vapor chamber 120 to allow the steam of the working fluid in the main vapor chamber 110 to upwardly deliver to the first auxiliary vapor chamber 120 through the rectangular steam channel 410 so as to deliver the heat carried by the working fluid to the main heat dissipation fin set 140 and the auxiliary heat dissipation fin set through the first cooling surface 222 and the second cooling surface 224 to dissipate the heat. In addition, the condensed working fluid may flow down to a chamber 476 of the main vapor chamber 110 by way of the spacer structure 420.

In some embodiments, the spacer structures 420 are made of metal structures or capillary structures.

In some embodiments, the first auxiliary vapor chamber 120 further includes a capillary layer 450, for example, a fiber layer, a sintered powder layer or a metal wire mesh layer, to form on the surface of the cylindrical steam channel 410. When the steam of the working fluid is condensed, the return speed of the condensed working fluid is accelerated through the capillary layer 450 so as to guide the condensed working fluid down to the main vapor chamber 110, and further deliver the condensed working fluid to the position, in contact with the heat source, of the main vapor chamber 110.

In some embodiments, the first auxiliary vapor chamber 120 further includes capillary columns 460, for example, fiber columns, sintered powder columns or metal wire mesh columns, to connect the capillary layer 450 and the capillary structure 478 on the inner surface of the lower cover 474 of the main vapor chamber 110 so as further to accelerate the return speed of the condensed working fluid.

In some embodiments, the first auxiliary vapor chamber 120 further includes a welding notch 440, and the first engaging protrusion 212 of the main vapor chamber 110 includes a welding protrusion 473 formed on the upper cover 472 to increase the tightness between the auxiliary vapor chamber 120 and the main vapor chamber 110. The welding notch 440 is located on the welding protrusion 473 and expose the welding protrusion 473, and the solder is disposed between the welding notch 440 and the welding protrusion 473 so as to further stably and tightly fix the first auxiliary vapor chamber 120 in the first engaging protrusion 212 of the main vapor chamber 110. Therefore, the rectangular steam channel 410 can further increase the width of the steam channel so that the working fluid can flow more smoothly to the first auxiliary vapor chamber 120 to condense the working fluid.

Figure 5:
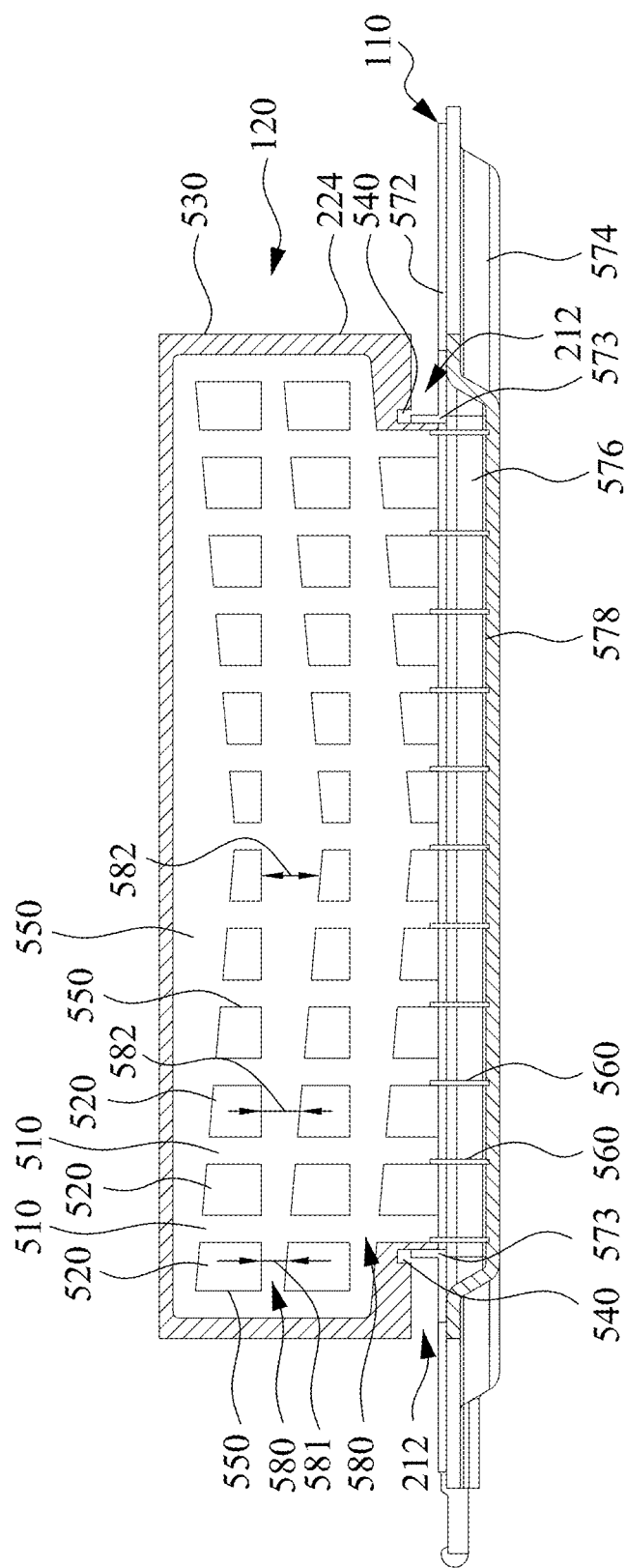
FIG. 5 illustrates a schematic cross-sectional view of further another embodiment of the vapor chamber of the heat dissipation module of FIG. 1.

Referring to FIG. 5, a schematic cross-sectional view of further another embodiment of the vapor chamber of the heat dissipation module 100 is illustrated. The first auxiliary vapor chamber 120 is also taken as an example, and the first cooling surface 222 of the first auxiliary vapor chamber 120 is removed to expose the interior of the second cooling surface 224. In general, the interior of the first cooling surface 222 and the interior of the second cooling surface 224 are symmetrically formed. The first auxiliary vapor chamber 120 includes a plurality of steam channels, for example, a plurality of vertical steam channels 510 and a plurality of horizontal steam channels 580. The horizontal steam channels 580 are arranged to intersect with the vertical steam channel 510, for example, vertically arranged to intersect with the vertical steam channel 510.

In some embodiments, the exterior of the first auxiliary vapor chamber 120 is a metal shell 530, and a plurality of spacer bumps 520 are formed inside the first auxiliary vapor chamber 120. In addition, the plurality of vertical steam channels 510 and the plurality of horizontal steam channels 580 are formed between the plurality of spacer bumps 520 of the first auxiliary vapor chamber 120 to allow the steam of the working fluid in the main vapor chamber 110 to upwardly deliver to the first auxiliary vapor chamber 120 through the vertical steam channels 510 so as to deliver the heat carried by the working fluid to the main heat dissipation fin set 140 and the auxiliary heat dissipation fin set through the first cooling surface 222 and the second cooling surface 224 to dissipate the heat. In addition, the condensed working fluid may be delivered down to a chamber 576 of the main vapor chamber 110 by way of surfaces of the vertical steam channels 510 and the horizontal steam channels 580, and the spacer bumps 520.

In some embodiments, the spacer bumps 520 are made of metal structures or capillary structures.

In some embodiments, the first auxiliary vapor chamber 120 further includes a capillary layer 550, for example, a fiber layer, a sintered powder layer or a metal wire mesh layer, to form on the surfaces of the vertical steam channels 510 and the horizontal steam channels 580 and/or the surface of the spacer bumps 520. When the steam of the working fluid is condensed, the return speed of the condensed working fluid is accelerated through the capillary layer 550 so as to guide the condensed working fluid down to the main vapor chamber 110, and further deliver the condensed working fluid to the position, in contact with the heat source, of the main vapor chamber 110.

It is worth noting that the horizontal steam channels 580 are formed by the indentation located between the plurality of spacer bumps 520, and the spacer bumps 520 are formed above and below the horizontal steam channel 580 respectively. In addition, the closer to the center of the first auxiliary vapor chamber 120, the wider the interval of the horizontal steam channel 580. In some embodiments, the first interval 581 is smaller than the second interval 582, and the second interval 582 is smaller than the third interval 583.

In addition, the heights of the upper surfaces of the spacer bumps 520 below the horizontal steam channel 580 gradually decrease while approaching a center of the first auxiliary vapor chamber 120 to form a concave shape so as to guide the condensed working fluid along the inclined angle on the upper surfaces of the spacer bumps 520 and/or the capillary layer 550 on the upper surfaces of the spacer bumps 520 to allow the condensed working fluid flowing to the center of the first auxiliary vapor chamber 120, i.e. the position of the heat source, to accelerate the cycle speed of the working fluid.

In some embodiments, similarly, the first auxiliary vapor chamber 120 further includes capillary columns 560, for example, fiber columns, sintered powder columns or metal wire mesh columns, to connect the capillary layer 550 and the capillary structure 578 on the inner surface of the lower cover 574 of the main vapor chamber 110 so as further to accelerate the return speed of the condensed working fluid.

In some embodiments, the first auxiliary vapor chamber 120 further includes a welding notch 540, and the first engaging protrusion 212 of the main vapor chamber 110 includes a welding protrusion 573 formed on the upper cover 572 to increase the tightness between the auxiliary vapor chamber 120 and the main vapor chamber 110. The welding notch 540 is located on the welding protrusion 573 and expose the welding protrusion 573, and the solder is disposed between the welding notch 540 and the welding protrusion 573 so as to further stably and tightly fix the first auxiliary vapor chamber 120 in the first engaging protrusion 212 of the main vapor chamber 110. Therefore, the horizontal steam channels 580 can horizontally communicate with the vertical steam channels 510 to allow the steam of the working fluid communicating with each other and the condensed working fluid can flow to the center position, i.e. the heat source position, by way of the inclined angle to improve the cooling efficiency of the heat dissipation module 100.

Figure 6:
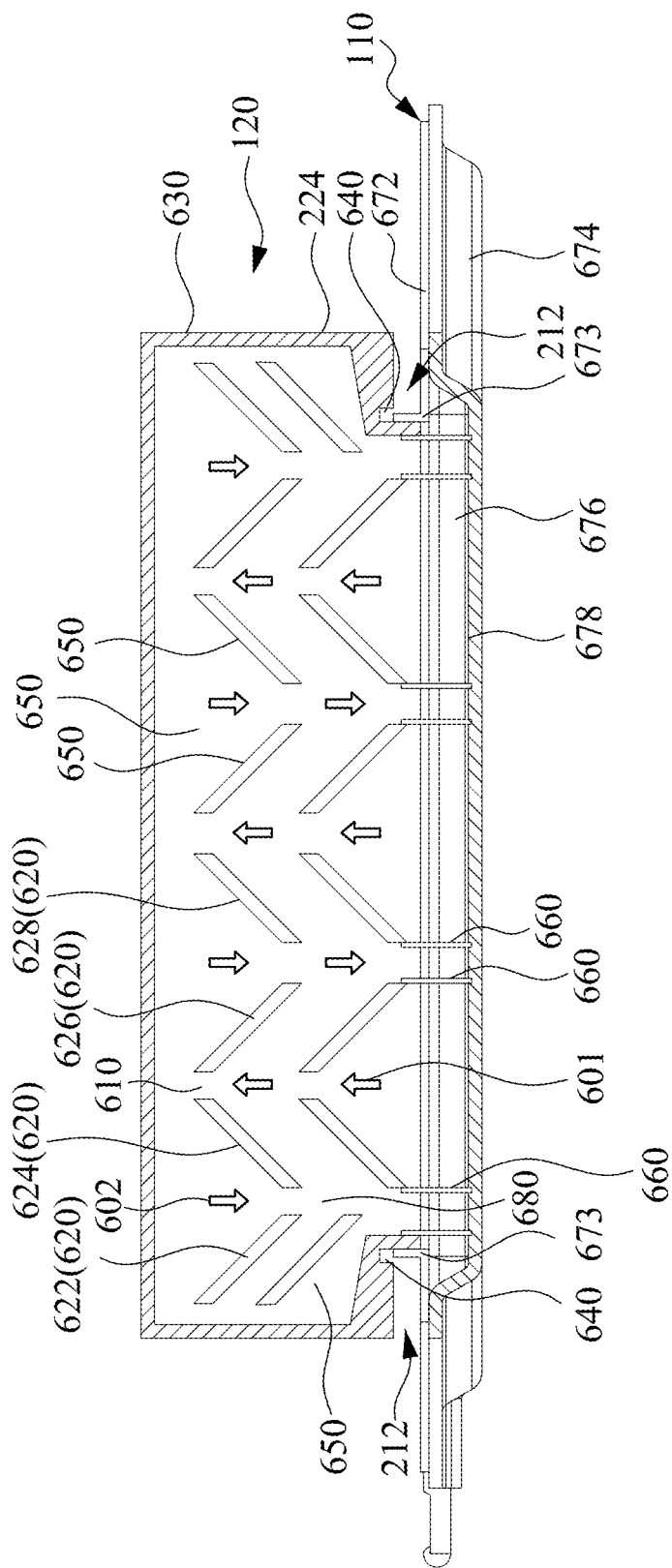
FIG. 6 illustrates a schematic cross-sectional view of still further another embodiment of the vapor chamber of the heat dissipation module of FIG. 1.

Referring to FIG. 6, a schematic cross-sectional view of still further another embodiment of the vapor chamber of the heat dissipation module 100 is illustrated. The first auxiliary vapor chamber 120 includes a plurality of steam channels and a plurality of fluid return channels, for example, steam channels 610 and a plurality of fluid return channels 680. The fluid return channels 680 and the steam channels 610 are staggered.

In some embodiments, the exterior of the first auxiliary vapor chamber 120 is a metal shell 630 and a plurality of spacer bumps 620 are formed in the first auxiliary vapor chamber 120. In addition, first spacer bumps 622, second spacer bumps 624, third spacer bumps 626 and fourth spacer bumps 628 are taken as examples for description. The first spacer bumps 622 and the third spacer bumps 626 are inclined from the top left to the bottom right of the drawing. In addition, the second spacer bumps 624 and the fourth spacer bumps 628 are inclined from the top right to the bottom left of the drawing. The first spacer bumps 622, the second spacer bumps 624, the third spacer bumps 626 and the fourth spacer bumps 628 are sequentially arranged, and may be repeated in the first auxiliary vapor chamber 120.

In some embodiments, the spacer bumps 620 are made of metal structures or capillary structures.

A slot is formed between the second spacer bump 624 and the third spacer bump 626 to form a steam channel 610 that gradually rises and tapers towards a center thereof to allow the steam upwardly flowing along the arrow direction 601. In addition, by using the design of gradually rising and tapering in the center of the second spacer bump 624 and the third spacer bump 626 to form a steam guiding channel to effectively accelerate the steam of the working fluid to flow upwardly, and the condensed working fluid may reflow to a low pressure area after the steam is condensed adjacent the top of the first auxiliary vapor chamber 120.

Therefore, the condensed working fluid may flow through a fluid return channel 680, i.e. a downward tapering slot between the first spacer bump 622 and the second spacer bump 624, along an arrow direction 602 to the main vapor chamber 110 at bottom. That is to say, the first spacer bump 622, the second spacer bump 624, the third spacer bump 626 and the fourth spacer bump 628 are wavily arranged to form wave-shaped inclined spacer bumps. In addition, the inclined spacer bumps are spaced apart from each other to form slots in the wavy turning area. The slot is formed and located between the first spacer bump 622 and the second spacer bump 624, and formed and located between the second spacer bump 624 and the third spacer bump 626 as described above. In addition, an end, adjacent to the steam channel 610, of the inclined spacer bumps is higher than another end, adjacent to the fluid return channel 680, of the inclined spacer bumps.

In some embodiments, the first auxiliary vapor chamber 120 further includes a capillary layer 650, for example, a fiber layer, a sintered powder layer or a metal wire mesh layer, to form on the surfaces of the steam channel 610 and the fluid return channel 680 and/or the surface of the spacer bumps 620. When the steam of the working fluid is condensed, the return speed of the condensed working fluid is accelerated through the capillary layer 650 so as to guide the condensed working fluid down to a chamber 676 of the main vapor chamber 110, and further deliver the condensed working fluid to the position, in contact with the heat source, of the main vapor chamber 110.

In some embodiments, similarly, the first auxiliary vapor chamber 120 further includes capillary columns 660, for example, fiber columns, sintered powder columns or metal wire mesh columns, to connect the capillary layer 650 and the capillary structure 678 on the inner surface of the lower cover 674 of the main vapor chamber 110 so as further to accelerate the return speed of the condensed working fluid.

In some embodiments, the first auxiliary vapor chamber 120 further includes a welding notch 640, and the first engaging protrusion 212 of the main vapor chamber 110 includes a welding protrusion 673 formed on the upper cover 672 to increase the tightness between the auxiliary vapor chamber 120 and the main vapor chamber 110. The welding notch 640 is located on the welding protrusion 673 and expose the welding protrusion 673, and the solder is disposed between the welding notch 640 and the welding protrusion 673 so as to further stably and tightly fix the first auxiliary vapor chamber 120 in the first engaging protrusion 212 of the main vapor chamber 110. Similarly, by way of the gaps between the first spacer bumps 622, the second spacer bumps 624, the third spacer bumps 626 and the fourth spacer bumps 628, the steam channels 610 are tilted upwards and may communicate to others. In addition, the fluid return channels 680 can utilize the design of the inclined spacer bumps to collect the condensed working fluid and flow downwardly so as to improve the cooling efficiency of the heat dissipation module 100.

Therefore, according to the structures described in the foregoing embodiments, the heat dissipation module of the present invention can utilize the steam channel to guide the steam of the working fluid to flow upward, and guide the working fluid to a lower pressure area to condense and reflow. At the same time, with the inclined spacer bumps, capillary layers and capillary columns, the condensed working fluid may be guided to the position, in contact with the heat source, of the main vapor chamber so as to effectively improve the heat dissipation efficiency of the heat dissipation module.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat dissipation module, comprising:
   a main vapor chamber;
   at least one auxiliary vapor chamber in fluid communication with the main vapor chamber;
   a main heat dissipation fin set installed on the main vapor chamber;
   at least one auxiliary heat dissipation fin set connected to the at least one auxiliary vapor chamber, wherein the at least one auxiliary vapor chamber is arranged between the main heat dissipation fin set and the at least one auxiliary heat dissipation fin set, wherein the at least one auxiliary vapor chamber comprises:
   a first auxiliary vapor chamber; and
   a second auxiliary vapor chamber, wherein the first auxiliary vapor chamber and the second auxiliary vapor chamber are respectively connected to two opposite sides of the main heat dissipation fin set, wherein the at least one auxiliary heat dissipation fin set comprises:
   a first auxiliary heat dissipation fin set; and
   a second auxiliary heat dissipation fin set, wherein the first auxiliary vapor chamber is arranged between the main heat dissipation fin set and the first auxiliary heat dissipation fin set, and the second auxiliary vapor chamber is arranged between the main heat dissipation fin set and the second auxiliary heat dissipation fin set; and
   a supporting frame to support the main heat dissipation fin set, the first auxiliary heat dissipation fin set and the second auxiliary heat dissipation fin set, wherein the supporting frame comprises:
   a first side beam;
   a second side beam arranged opposite to the first side beam;
   a third side beam connected on the first side beam and the second side beam;
   a fourth side beam connected on the first side beam and the second side beam, wherein the fourth side beam is arranged opposite to the third side beam; and
   an opening formed between the first side beam, the second side beam, the third side beam and the fourth side beam, wherein the first auxiliary vapor chamber and the second auxiliary vapor chamber pass through the supporting frame via the opening.

2. The heat dissipation module of claim 1, wherein the main heat dissipation fin set comprises a plurality of heat dissipation fins vertically arranged on the main vapor chamber and fixed on the first side beam and the second side beam of the supporting frame.

3. The heat dissipation module of claim 1, wherein the first auxiliary heat dissipation fin set and the second auxiliary heat dissipation fin set respectively comprise a plurality of heat dissipation fins horizontally stacked on the third side beam and the fourth side beam of the supporting frame.

4. The heat dissipation module of claim 1, wherein the at least one auxiliary vapor chamber comprises a plurality of steam channels formed in the auxiliary vapor chamber.

5. The heat dissipation module of claim 4, wherein the steam channels comprise a plurality of cylindrical steam channels or a plurality of rectangular steam channels.

6. The heat dissipation module of claim 4, wherein the steam channels comprise a plurality of vertical steam channels.

7. The heat dissipation module of claim 6, wherein the steam channels further comprise a plurality of horizontal steam channels arranged to intersect with the vertical steam channels.

8. The heat dissipation module of claim 7, wherein the horizontal steam channels are formed by a plurality of spacer bumps and heights of upper surfaces of the spacer bumps below each of the horizontal steam channels gradually decrease while approaching a center of the at least one auxiliary vapor chamber.

9. The heat dissipation module of claim 4, wherein the at least one auxiliary vapor chamber further comprises a plurality of fluid return channels, wherein the plurality of steam channels and the plurality of fluid return channels are staggered.

10. The heat dissipation module of claim 9, wherein the plurality of steam channels and the plurality of fluid return channels are formed by a plurality of inclined spacer bumps.

11. The heat dissipation module of claim 10, wherein the plurality of inclined spacer bumps are wavily arranged to form the plurality of steam channels and the plurality of fluid return channels, and the plurality of inclined spacer bumps are spaced apart from each other so as to form a slot in a wavy turning area.

12. The heat dissipation module of claim 11, wherein one end, adjacent to one of the plurality of steam channels, of each of the plurality of inclined spacer bumps is higher than another end, adjacent to one of the plurality of fluid return channels, of the each of the plurality of inclined spacer bumps.

13. A heat dissipation module, comprising:
a main vapor chamber;
at least one auxiliary vapor chamber in fluid communication with the main vapor chamber;
a main heat dissipation fin set installed on the main vapor chamber;
at least one auxiliary heat dissipation fin set connected to the at least one auxiliary vapor chamber, wherein the at least one auxiliary vapor chamber is arranged between the main heat dissipation fin set and the at least one auxiliary heat dissipation fin set, wherein the at least one auxiliary vapor chamber comprises a plurality of steam channels formed in the auxiliary vapor chamber and a plurality of fluid return channels, wherein the plurality of steam channels and the plurality of fluid return channels are staggered, wherein a capillary layer is formed on surfaces of the plurality of steam channels and the plurality of fluid return channels.

14. The heat dissipation module of claim 13, wherein the plurality of fluid return channels further comprise a capillary column to connect the capillary layer and a capillary structure formed on a surface of a lower cover of the main vapor chamber.

15. The heat dissipation module of claim 4, wherein the plurality of steam channels are formed by slots in spacer structures.

16. The heat dissipation module of claim 15, wherein a capillary layer is formed on surfaces of the plurality of steam channels.

17. The heat dissipation module of claim 16, wherein each of the plurality of steam channels further comprises a capillary column to connect to the capillary layer and a capillary structure formed on a surface of a lower cover of the main vapor chamber.

\* \* \* \* \*